United States Patent [19]

Horita et al.

[11] Patent Number: 5,469,081
[45] Date of Patent: Nov. 21, 1995

[54] CIRCUIT FOR INTERCONNECTING INTEGRATED SEMICONDUCTOR CIRCUITS

[75] Inventors: Satomi Horita; Yasushi Aoki; Masahiro Wakana, all of Tokyo; Hiroshi Okamoto, Miyagi; Kiyohiko Chiba, Miyagi; Shizue Daikoku, Miyagi, all of Japan

[73] Assignee: NEC Corporation, Tokyo, Japan

[21] Appl. No.: 292,142

[22] Filed: Aug. 8, 1994

Related U.S. Application Data

[63] Continuation of Ser. No. 848,098, Mar. 9, 1992, abandoned.

[30] Foreign Application Priority Data

Mar. 7, 1991 [JP] Japan .................................. 3-069005
Aug. 22, 1991 [JP] Japan .................................. 3-211160

[51] Int. Cl.[6] .......................................... H03K 19/0175
[52] U.S. Cl. .............................. 326/81; 326/86; 326/68; 327/72; 327/77
[58] Field of Search .................................. 307/443, 475, 307/358, 362, 494; 327/77, 72; 326/81, 68

[56] References Cited

U.S. PATENT DOCUMENTS

| | | | |
|---|---|---|---|
| 4,437,171 | 3/1984 | Hudson | 307/475 |
| 4,890,019 | 12/1989 | Hoyte | 307/475 |
| 4,947,061 | 8/1990 | Metz | 307/358 |
| 5,043,604 | 8/1991 | Komaki | 307/475 |
| 5,045,730 | 9/1991 | Cooperman | 307/443 |
| 5,047,657 | 9/1991 | Seevinck | 307/362 |
| 5,111,080 | 5/1992 | Mizukami | 307/475 |

*Primary Examiner*—Edward P. Westin
*Assistant Examiner*—Andrew Sanders
*Attorney, Agent, or Firm*—Sughrue, Mion, Zinn, Macpeak & Seas

[57] ABSTRACT

An interconnection circuit having a circuit portion which is provided in one of two integrated semiconductors to be connected, for limiting the amplitude in voltage of the signal output from said one circuit, and another circuit portion which is provided in the other one of the two circuits, for discriminating the logic level of the signal input thereinto based on a threshold level set at an intermediate level between said amplitude. The amplitude of the logic signal transferred across the two circuits is thus compressed, thereby decreasing delay time for the signal to transfer between the two circuits.

15 Claims, 9 Drawing Sheets

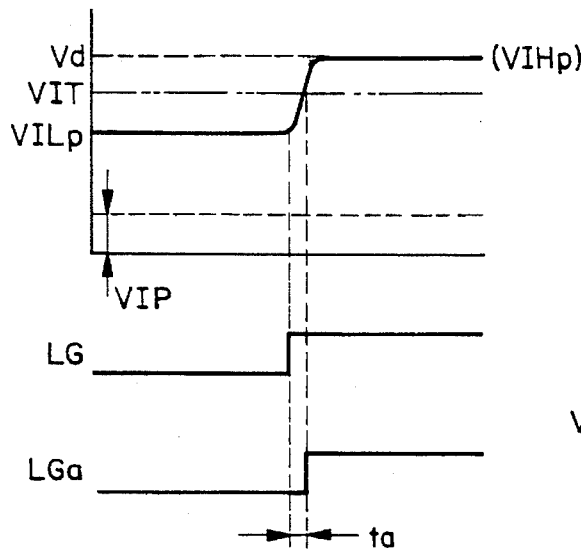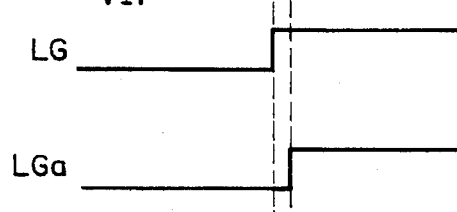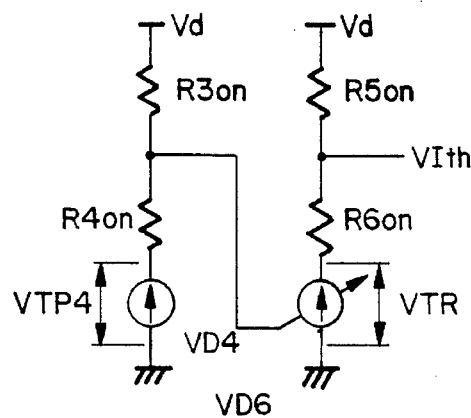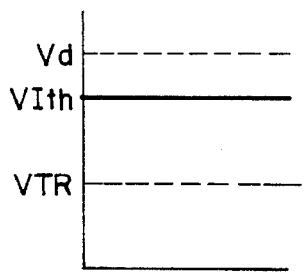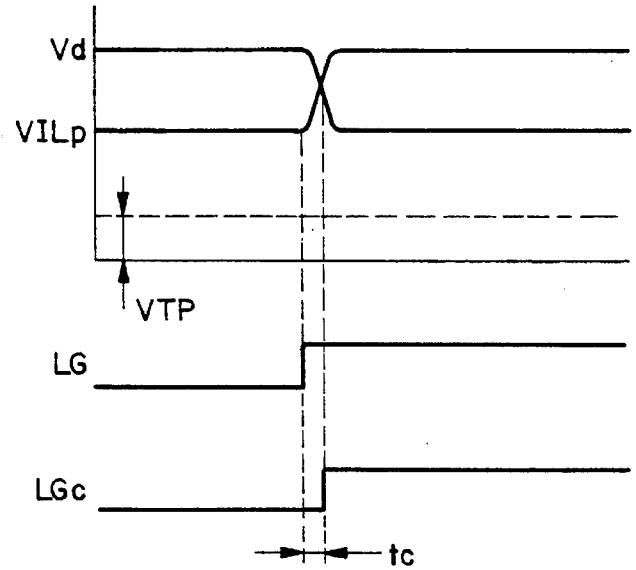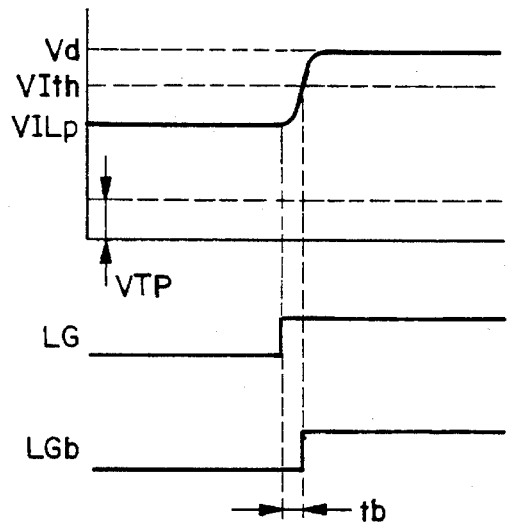

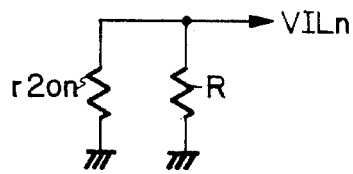
FIG. 11(a)
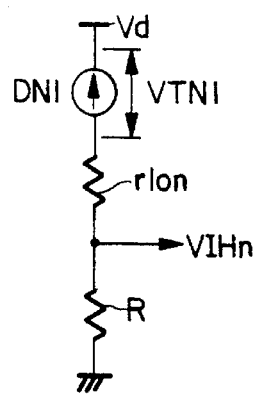
FIG. 11(b)
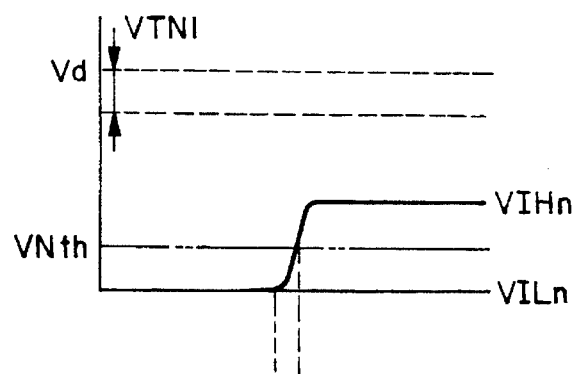
FIG. 12(a)
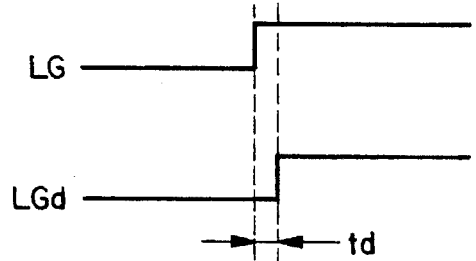
FIG. 12(b)
FIG. 12(c)
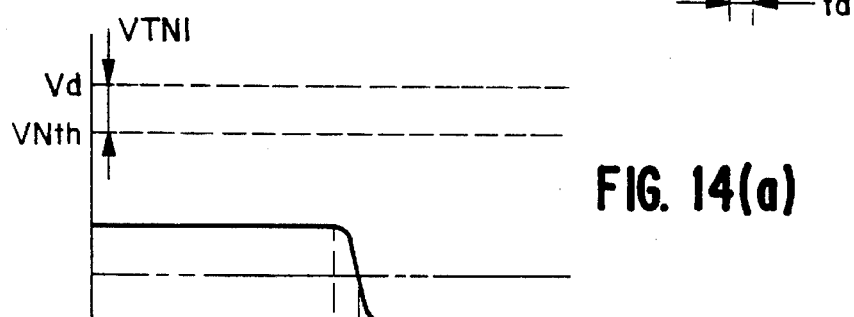
FIG. 14(a)
FIG. 14(b)
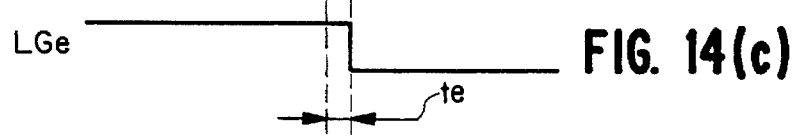
FIG. 14(c)

FIG. 16(a)
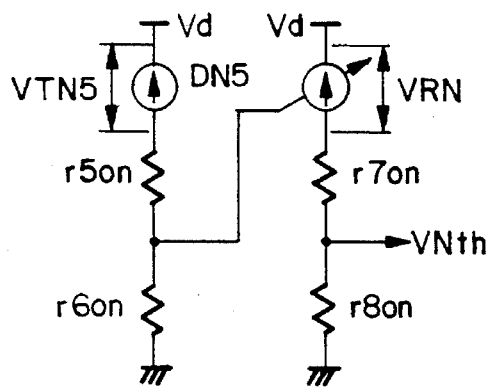
FIG. 16(b)
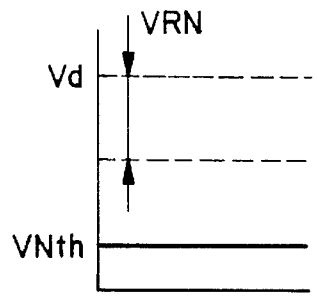
FIG. 17(a)
FIG. 17(b)
FIG. 17(c)
FIG. 19(a)
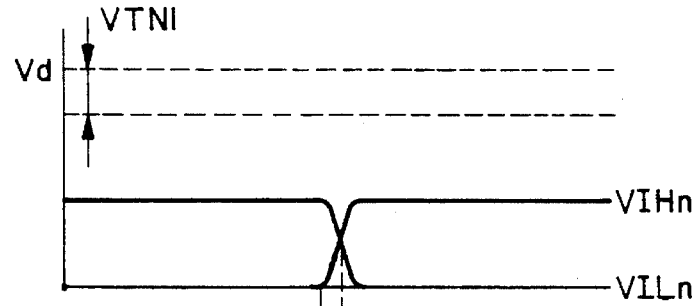
FIG. 19(b) LG
FIG. 19(c) LGg
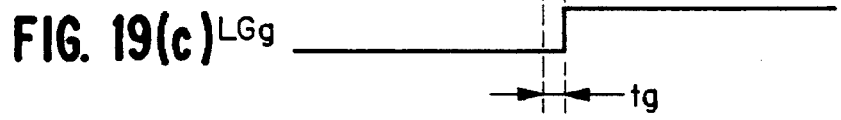

5,469,081

CIRCUIT FOR INTERCONNECTING INTEGRATED SEMICONDUCTOR CIRCUITS

This is a Continuation of application Ser. No. 07/848,098 filed Mar. 9, 1992, now abandoned.

FIELD OF THE INVENTION

The invention relates to a circuit (hereinafter referred to as interconnection circuit) for interconnecting two integrated semiconductor circuits for transferring a logic signal of a given level from one of the integrated circuits to the other. The interconnection circuit is provided in the signal path between the two integrated semiconductor circuits with a terminal resistor for adjusting impedances.

BACKGROUND OF THE INVENTION

Electronic devices for data processing and data communication are generally designed to permit fast data transmission between semiconductor circuits. For example, in those portions where especially fast operations are needed, bipolar semiconductor circuits including emitter coupled logics (ECL) are used, while in other portions CMOS semiconductor circuits are used.

In cases when coexisting semiconductor circuits have different characteristics as mentioned above, the operating levels of the semiconductor circuits may be different. Accordingly, an output of a semiconductor circuit may not be directly coupled to other semiconductor circuits.

Conventionally, when the output level of a first semiconductor circuit is different from the input level of a second semiconductor circuit to be connected with the first circuit, a level converter is provided between the two so that the output level of the first circuit is adjusted or matched to that of the second circuit.

A typical converter 5 shown in FIG. 1 is installed between an output buffer 2 for a CMOS circuit 1 consisting of CMOS semiconductors and an input buffer 4 for a bipolar circuit Such inverter is designed to convert the level of the logic signal SO of the CMOS circuit 1 to the level of the input SI of the bipolar circuit 3.

The level converter 5 interfaces a CMOS circuit coupled with a bipolar circuit, and may convert the logic level of the CMOS circuit in the range of 0–5 volts to the logic level of the ECL (bipolar logic) in the range of −0.8—1.7 volts.

However, such prior art devices have the following disadvantages.

Firstly, it requires an independent converter 5, which implies that additional components are required in manufacturing an electronic device, thereby not only adversely affecting the cost efficiency of the device but also requiring extra space within the substrate. Furthermore, the converter requires extra electric power.

Another serious problem pertinent to such devices is that when the distance between the CMOS circuit 1 and the converter 5 is long, floating capacity formed in the circuit board bearing them becomes so great that the operational speed of the CMOS circuit 1 will be lowered for a large output load. This impedes fast signal transfer between the circuits.

SUMMARY OF THE INVENTION

The invention is aimed at overcoming the disadvantages mentioned above, that is, to provide an interconnection circuit for realizing fast signal transfer between semiconductor circuits.

In order to carry out the object of the invention, there is provided in a first example of an interconnection circuit for interconnecting two integrated semiconductor circuits for transferring a logic signal of a given level from one of said integrated circuits to the other through a signal path therebetween. The said interconnection circuit is provided with a terminal resistor in the signal path for adjusting impedances. One of the semiconductor circuit outputting a logic signal has:

an inverter circuit for inverting the logic signal; a first p-channel MOS transistor, the gate of which is connected with the output of the inverter; and a second p-channel MOS transistor whose drain is coupled to the source of the first MOS transistor, and whose gate is coupled to the output of the one semiconductor circuit, the source of the first p-channel semiconductor and the drain of said second p-channel MOS transistor are connected further with one end of the signal path, and the other one of the semiconductor circuits is connected with the other end of the signal path for receiving a signal: a circuit for discriminating the levels of the signal by a threshold value which is approximately the mean of the maximum and the minimum of the levels of the signal is also provided.

With this arrangement, the logic level high (H) of an output circuit is maintained on one hand at substantially the same level as the power source voltage, and on the other hand the logic low (L) is maintained at a level equal to the power source voltage minus the threshold voltage of the p-channel MOS transistor, multiplied by the ratio of the resistance of the terminal resistor to the sum of the terminal resistance and the ON-state resistance of the second p-channel MOS transistor. Accordingly, the amplitude of the logic level is made smaller, so that fast signal transmission may be attained.

In a second example of the invention, there is provided an interconnection circuit for interconnecting two integrated semiconductor circuits for transferring a logic signal of a given level from one of the integrated circuits to the other through a signal path therebetween. The said interconnection circuit is provided with a terminal resistor in the signal path for adjusting impedances. The output circuit of one of the semiconductor circuits outputs a logic signal. The interconnection circuit has: an inverter circuit for inverting the logic signal; a first p-channel MOS transistor, the gate of which is connected with the output of said inverter; and a second p-channel MOS transistor whose drain is coupled to the source of the first MOS transistor, and whose gate is coupled to the output circuit. A node common to the source of the first p-channel MOS transistor and the drain of said second p-channel MOS transistor is connected with one end of said signal path. The said interconnecting circuit further includes a reference signal generator circuit for generating a reference signal at a level which is approximately intermediate the maximum and the minimum of the output signal of the output circuit. The input circuit of the other integrated semiconductor circuit includes a circuit for discriminating the levels of the signal on the signal path by the threshold of the reference signal.

In this arrangement, the logic level high (H) of the output circuit is maintained on one hand at substantially the same level as the power source voltage, and on the other hand the logic low (L) is maintained at a level equal to the power source voltage minus the threshold voltage of the p-channel MOS transistor, multiplied by the ratio of the resistance of the terminal resistor to the sum of the terminal resistance and the ON-state resistance of the second p-channel MOS transistor. Accordingly, the amplitude of the logic level is made smaller, so that fast signal transfer may be attained. In addition, since a reference signal generation circuit is provided for generating a threshold level which is not substantially affected by external influences, discrimination of the logic levels may be carried out under a stable condition.

In a third example of the invention, there is provided an interconnection circuit for interconnecting two integrated semiconductor circuits for transferring a logic signal of a given level from one of the integrated circuits to the other through a signal path therebetween, the interconnection circuit is provided with a terminal resistor in the signal path for adjusting impedances.

The output circuit of one of the semiconductor circuit outputting a logic signal has: an inverter circuit for inverting the logic signal; first and second p-channel MOS transistors, the gates of which are connected with the output of the inverter; a third p-channel MOS transistor whose drain is coupled to the source of the first MOS transistor, and whose gate is coupled to the output of the one integrated semiconductor circuit, and a fourth p-channel transistor whose source is connected with the drain of the second p-channel transistor, with a node common to the source of the first p-channel MOS transistor and the drain of the third p-channel MOS transistor is connected with one end of a first signal path, and the drain of said second p-channel MOS transistor and a node common to the source of said fourth p-channel MOS transistor is connected with one end of a second signal path. An input circuit of the other integrated semiconductor circuit includes a comparator for discriminating the levels of the output signal of the output circuit by comparing the levels of the first and second signal paths.

In this arrangement, influence of external noise is minimized, since the output logic is provided in two mutually inverted levels from the output circuit and hence the input circuit may discern the output logic from the difference between the output levels.

The semiconductor circuit outputting the signal is preferably a CMOS semiconductor circuit, while the other semiconductor circuit is preferably a bipolarsemiconducto-circuit. In this case it is easy to construct a proper input circuit suitable for logic discrimination even when the threshold is close to the power source voltage.

The reference signal generator circuit preferably has: a paired first and second p-channel MOS transistors, both which are adapted to be always turned on; a second p-channel MOS transistor which is adapted to be always turned on and whose drain is connected with the source of the first p-channel MOS transistor; a third p-channel MOS transistor which is adapted to be always turned on; and a fourth p-channel MOS transistor whose gate is connected with a node common to the source of the first p-channel MOS transistor and the drain of the second p-channel MOS transistor, and whose drain is connected with the source of the third p-channel MOS transistor, with the voltage of the node being output as a threshold level.

Since this reference signal generation circuit may be constructed solely by p-channel MOS transistors, it is easy as to include one in an integrated semiconductor circuit, thereby minimizing the size of the circuit.

In a further example of the invention, there is provided an interconnection circuit for interconnecting two integrated semiconductor circuits for transferring a logic signal of a given level from one of the integrated circuits to the other through a signal path therebetween. The interconnection circuit is provided with a terminal resistor in the signal path for adjusting impedances. The output circuit of one of the semiconductor circuits has: an inverter circuit for inverting the logic signal; a first n-channel MOS transistor, the gate of which is connected with the output of the inverter; and a second n-channel MOS transistor whose source is coupled to the drain of the first MOS transistor, and whose gate is coupled to the output circuit. A node common to the drain of the first n-channel MOS transistor and the source of the second n-channel MOS transistor is connected with one end of the signal path. The input circuit of the other integrated semiconductor circuit includes a circuit for discriminating the levels of the signal in the signal path by a threshold value which is approximately intermediate the maximum and the minimum of the levels of the signal.

This construction of the interconnection permits fast signal transfer due to the fact that the high logic level H of the output circuit is converted to the power source voltage minus the threshold voltage of a first n-channel MOS transistor, multiplied by the ratio of the resistance of the terminal resistor to the sum of the resistance of the terminal resistor and the ON-state resistance of the first MOS transistor while keeping the low logic level L substantially at the ground level.

In a still further example of the invention, there is provided an interconnection circuit for interconnecting two integrated semiconductor circuits for transferring a logic signal of a given level from one of the integrated circuits to the other through a signal path therebetween. The interconnection circuit is provided with a terminal resistor in the signal path for adjusting impedances. The output circuit of one of the semiconductor circuits has: an inverter circuit for inverting the logic signal; a first n-channel MOS transistor, the gate of which is connected with the output of the inverter; and a second n-channel MOS transistor whose source is coupled to the drain of the first n-channel MOS transistor, and whose gate is coupled to said output circuit. A node common to the drain of the first n-channel MOS transistor and the source of the second n-channel MOS transistor is connected with one end of said signal path. The said interconnecting circuit further includes a reference signal generator circuit for generating a reference signal at a level which is approximately intermediate the maximum and the minimum of the output signal of the output circuit. The input circuit of the other integrated semiconductor circuit includes a circuit for discriminating the levels of the signal on the signal path by the threshold of the reference signal.

In this construction, the high logic level H of the output circuit is also converted to the power source voltage minus the threshold voltage of a first n-channel MOS transistor, multiplied by the ratio of the resistance of the terminal resistor to the sum of the resistance of the terminal resistor and the ON-state resistance of the first MOS transistor while keeping the low logic level L substantially at the ground level. In addition, stable discrimination of the signal levels is possible since a reference signal generator circuit may provide for a threshold level for the input circuit.

In a still further example of the invention, there is provided an interconnection circuit for interconnecting two integrated semiconductor circuits for transferring a logic signal of a given level from one of the integrated circuits to the other through a signal path therebetween. The interconnection circuit is provided with a terminal resistor in the signal path for adjusting impedances. The output circuit of one of the semiconductor circuit has: an inverter circuit for inverting the logic signal; first and second n-channel MOS transistors, the gates of which are connected with the output of the inverter; a third n-channel MOS transistor whose source is coupled to the drain of the first MOS transistor, and whose gate is coupled to the output of the one integrated semiconductor circuit, and a fourth n-channel transistor whose drain is connected with the source of said second n-channel transistor. A node common to the source of the first n-channel MOS transistor and the drain of said third n-channel MOS transistor is connected with one end of a first signal path, and the drain of the second n-channel MOS transistor. A node common to the source of said fourth n-channel MOS transistor is connected with one end of a second signal path, and that an input circuit of the other integrated semiconductor circuit includes a comparator for discriminating the levels of the output signal of the output circuit by comparing the levels of the first and second signal paths.

In this construction, external noise is minimized due to the fact that two mutually inverted output levels are derived from the output circuit and that the discrimination of the output levels is based on the difference between them.

Both of the integrated semiconductor circuits are preferably CMOS semiconductor circuits, thereby bringing the level of the signal to be transferred close to the ground level so that the transfer is less affected by external noises.

In still further example of the invention, there is provided an interconnection circuit for interconnecting two integrated semiconductor circuits. The reference signal generator circuit of this device has: a pair of first and second n-channel MOS transistors, both of which are adapted to be always turned on; a second n-channel MOS transistor which is adapted to be always turned on and whose drain is connected with the source of the first n-channel MOS transistor; a third n-channel MOS transistor which is adapted to be always turned on; and a fourth n-channel MOS transistor whose gate is connected with a node common to the source of the first n-channel MOS transistor and the drain of the second n-channel MOS transistor, and whose source is connected with the drain of the third n-channel MOS transistor, with the voltage of the node being output as a threshold level.

Since this reference signal generation circuit may also be constructed solely by n-channel MOS transistors, it is easy to include one in an integrated semiconductor circuit, thereby minimizing the size of the circuit.

BRIEF DESCRIPTION OF THE DRAWINGS

FIGS. 4(a) through 4(c) are graphical representation of wave forms useful in explaining the operation of the circuit shown in FIG. 2.

FIG. 6(a) shows an equivalent circuit for a reference signal generator circuit of FIG. 5.

FIG. 6(b) shows the levels of the reference signal output from the reference signal generator circuit of FIG. 5.

FIGS. 7(a) through 7(c) are graphical representation of waveforms useful in explaining the operation of the circuit shown in FIG. 5.

FIGS. 9(a) through 9(c) are graphical representation of waveforms useful in explaining the operation of the circuit shown in FIG. 8.

FIGS. 11(a) and 11(b) show equivalent circuits for the output circuit of FIG. 10.

FIGS. 12(a) through 12(c) are graphical representation of waveforms useful in explaining the operation of the circuit shown in FIG. 10.

FIGS. 14(a) through 14(c) are graphical representations of waveforms useful in explaining the operation of the circuit shown in FIG. 13.

FIG. 16(a) is an equivalent circuit for a reference signal generator circuit of FIG. 13.

FIG. 16(b) shows the levels of the reference signal output from the reference signal generator circuit of FIG. 13.

FIGS. 17(a) through 17(c) are graphical representation of waveforms useful in explaining the operation of the circuit shown in FIG. 5.

FIGS. 19(a) through 19(c) are graphical representation of waveforms useful in explaining the operation of the circuit shown in FIG. 18.

DETAILED DESCRIPTION OF THE PREFERRED EMBODIMENT

The invention will now be described by way of examples with reference to the accompanying drawings.

Figure 1:
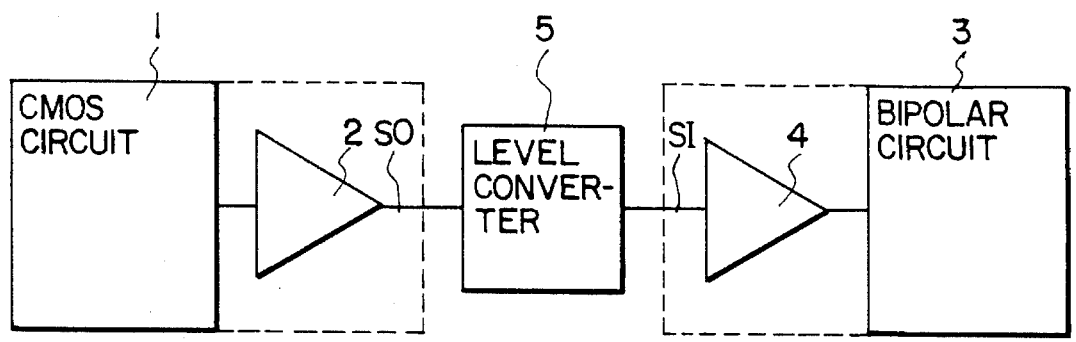
FIG. 1 is a block diagram of a prior art interconnection circuit for connecting integrated semiconductor circuits.
Figure 2:
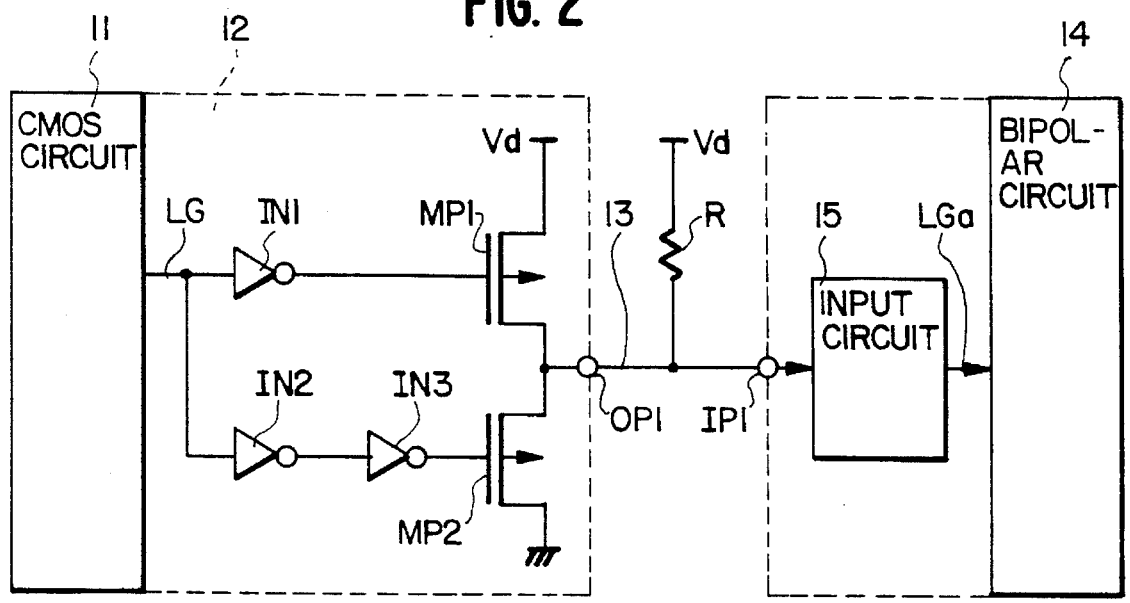
FIG. 2 is an illustration of a first embodiment of the invention.

A first embodiment of the invention is shown in FIG. 2, in which an integrated semiconductor circuit 11 consists of CMOS circuits. The circuit 11 outputs from its output circuit 12 a logic signal LG on a signal path 13, which is connected to a power source of voltage Vd via a terminal resistor R provided to adjust the impedance of the signal path 13 to a predetermined value.

The signal LG output from the CMOS circuit 11 is applied to an inverters IN1 and IN2 in the output circuit 12. The output of the inverter IN2 is coupled to an inverter IN3.

The output of the inverter IN1 is connected to the gate of a p-channel MOS transistor MP1. The output of the inverter IN3 which is inverted in logic level with respect to the output of the inverter 1 is applied to the gate of a p-channel transistor MP2.

The drain and the source of the p-channel MOS transistor MP1 are connected to the power source of voltage Vd and to the drain of the p-channel MOS transistor MP2, respectively.

The source of the p-channel MOS transistor MP2 is grounded.

The source of the p-channel MOS transistor MP1 and the drain of the p-channel transistor MP2 are connected together to a common output terminal OP1.

The output terminal OP1 of the output circuit 12 is connected to one end of the signal path 13. The other end of signal path 13 is connected to an input IP1 of an input terminal circuit 15, whose output LGa is connected to an integrated circuit 14 consisting of bipolar semiconductor circuits.

In this arrangement, a logic signal LG at low level L output from the CMOS circuit. 11 causes the inverter IN1 to output a logic signal high H and the inverter IN8 to output a logic signal low L, which in turn cause the p-channel transistor MP1 to be turned OFF, and MP2 to be turned ON.

Figure 3A:
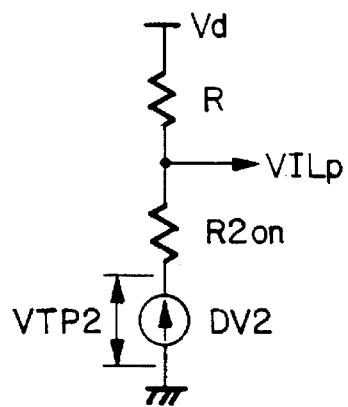
FIGS. 3(a) and 3(b) show equivalent circuits for the output circuit of FIG. 2.

The output circuit 12 is dentical in function with an equivalent circuit as shown in FIG. 3(a), which consists of a terminal resistor R, an ON-state resistor R2on of the p-channel transistor MP2, and a DC power source of voltage DV2 representing the threshold voltage VTP2 for the p-channel MOS transistor MP2, and a source voltage Vd, all connected in series between the power source of voltage Vd and the ground.

If on the other hand the level of the logic signal LG of the CMOS circuit 11 goes high H, the output of the inverter IN1 is changed to low L, while the output of the inverter IN3 is changed to high H. Accordingly, the p-channel MOS transistor MP1 is turned ON and the transistor MP2 is turned OFF.

Figure 3B:
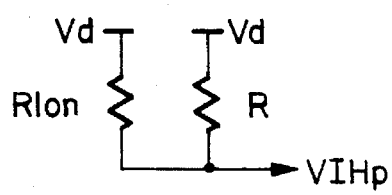

In this case the output circuit 12 is equivalent to a circuit shown in FIG. 3(b), which consists of an ON-state resistor R1on connected in parallel with a terminal resistor R between the power source of voltage Vd and the output terminal OP1. Accordingly, when the logic signal LG is low L, the voltage level VILp of the output terminal OP1 equals the power source voltage Vd minus the threshold voltage VTP2 above the ground level, multiplied by the ratio of the resistance of the terminal resistor R to the sum of R and the ON -state resistor R2on, as shown in FIG. 4(a).

On the other hand when the output logic signal LG is high H, the level VIHp of the output terminal OP1 is essentially the same as the power source voltage Vd.

In the input circuit 15 a threshold level VIT is established for identification of the logic high H by discriminating the level VIHp from the level VILp. To do this, the input circuit 15 is adapted to alter the logic level of the output LGa from low L to high H at a time ta after the level of the output terminal OP1 of the output circuit 12 begins to rise from VILp towards the level VIHp in response to the change in logic state of the signal LG of the CMOS circuit 11 from low L to high H, as shown in FIG. 4 (b) and (c).

It should be noted that in the example described above the amplitude of the signal on the signal path 13 is limited within a small range defined by the levels VILp and VIHp, so that the time delay ta is much smaller compared to conventional delay times, thereby permitting fast signal transfer.

In a typical example where the power source voltage Vd is 5 volts; the terminal resistor, 50 ohms; and the threshold voltage VTP2 in the range from 1.2 to 1.3 volts, the level VILp will be in the range of 3–4 volts. One may then set the threshold VIT at about 4.5 volts.

It should be appreciated that in the first example described above the output signal of the CMOS circuit 11 may be input to the bipolar circuit 14 directly, the CMOS circuit 11 and the bipolar circuit 14 may be manufactured without an independent transistorized level converter circuit interface, thereby improving manufacturing cost of the integrated circuit. Furthermore, since no extra space is needed for an independent level converter, further down sizing of integrated circuits may be achieved.

It should be also appreciated that the interconnection circuit above has very stable operational characteristics. That is, the interconnection circuit is not substantially affected by ambient temperature and other conditions, since the output stage of the circuit 12 is formed by identical p-MOS transistors MP1 and MP2 so that fluctuations of ambient conditions tend to cancel each other out. Fluctuations in quality of the transistors encountered during manufacture also tend to cancel out.

Figure 5:
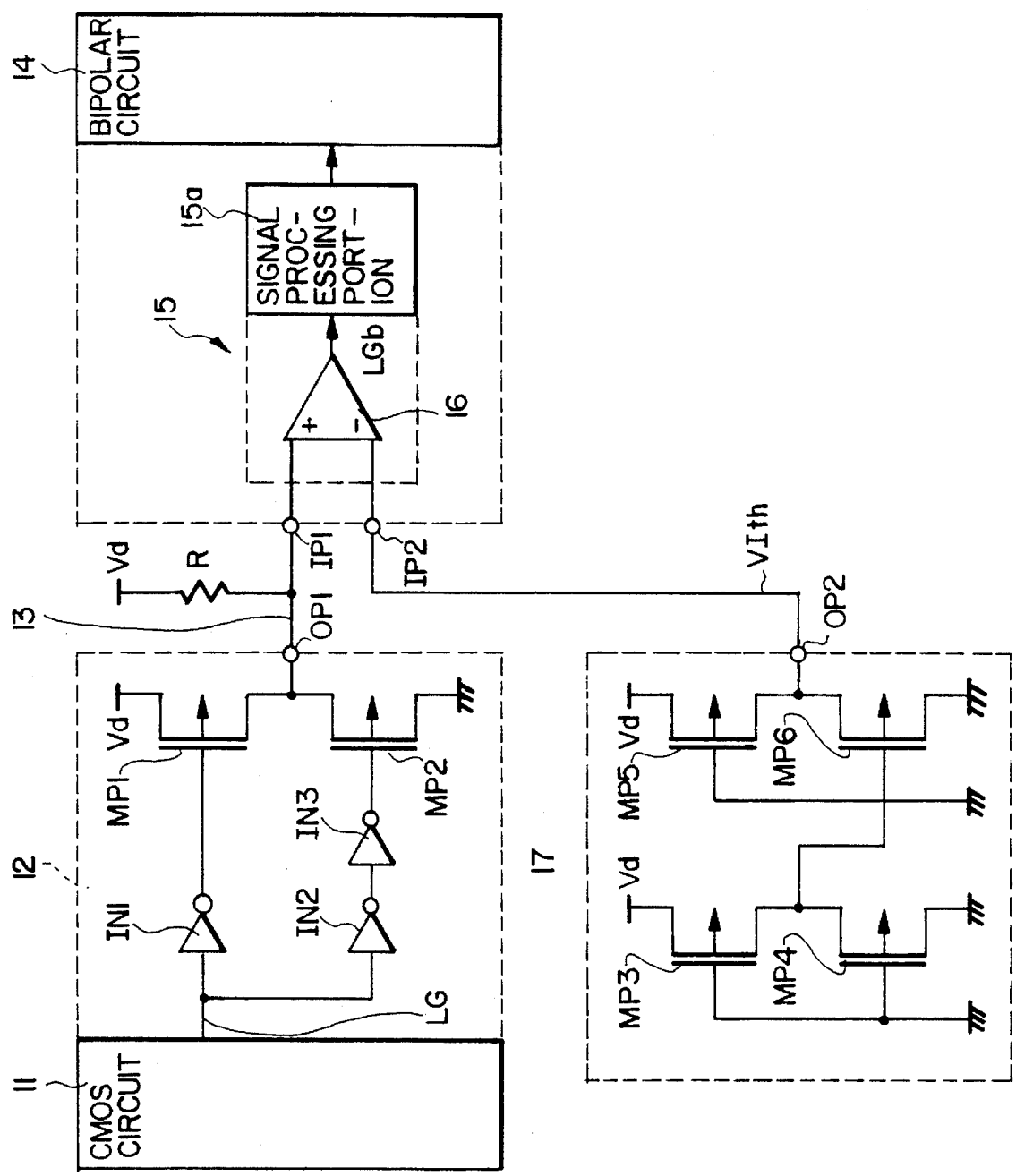
FIG. 5 is an illustration of a second embodiment of the invention.

Referring now to FIG. 5, there is shown a second embodiment of the invention, in which the same reference numbers as in FIG. 2 represent the same or similar components.

A bipolar circuit 14 has two input terminals IP1 and IP2, which are connected to the plus end and minus end, respectively, of a differential amplifier 16 provided in an input circuit 15. The output signal LGb of the differential amplifier 16 is supplied as an input signal to a signal processing portion 15a of the input circuit 15.

A reference signal generation circuit 17 includes a set of p-channel MOS transistors MP3 and MP4, with the drain of the transistor MP3 connected to a power source voltage Vd, the source of the transistor MP4 grounded, the source of the transistor MP3 connected to the drain of the transistor MP4, and both gates of the transistors MP3 and MP4 are grounded. Accordingly, the transistors MP3 and MP4 are both always turned ON.

The reference signal generation circuit 17 also has another set of p-channel transistors MP5 and MP6, with the drain of the transistor MP5 connected with the the power source of voltage Vd, the source of the transistor MP6 grounded, the source of the transistor MP5 connected with the drain of the transistor MP6. The gate of the p-channel MOS transistor MP5 is grounded. Accordingly, the transistors MP5 is always turned ON. The gate of the transistor MP6 is connected to a node common to the source of the transistor MP3 and the drain of the transistor MP4. The source of the transistor MP5 and the drain of the transistor MP6 are connected to a common output terminal OP2 of the reference signal generation circuit 17.

The output terminal OP2 is connected to an input IP2 of the bipolar circuit 14, which is the minus end of a differential amplifier 16. The terminal OP2 provides a threshold voltage VIth.

FIG. 6(a) shows an equivalent circuit for the reference signal generation circuit 17. The portion including the p-channel MOS transistors MP3 and MP4 is equivalent to a series of resistances R3on and R4on of ON-state transistors MP3 and MP4, respectively, and a DC voltage DV4 representing the threshold voltage VTP4 of the transistor MP4, all connected in this order between the power source Vd and the ground.

As a result, the gate voltage of the transistor MP6 equals the voltage Vd minus the threshold voltage VTP4, multiplied by the ratio of the ON-state resistance R3on to the sum of R3on and R4on.

Similarly, the portion including the p-channel transistors MP5 and MP6 is equivalent to a series of a resistance R5on representing the ON-state resistance of the p-channel transistor MP5, a resistance R6on representing the ON-state resistance of the p-channel transistor MP6, and a DC voltage source DV6 which equals in magnitude to the gate voltage VTR of the transistor MP6, all connected in this order between the power source Vd and the ground.

Accordingly, the threshold voltage VIth is given by the source voltage Vd minus the threshold voltage VTR, multiplied by the ratio of the resistance R5on to the sum of R5on and R6on, as shown in FIG. 6. Thus, by appropriately choosing the values of the ON-state resistances R3on, R4on, R5on, and R6on, of the p-channel transistors MP3, MP4, MP5, and MP6, respectively, the threshold voltage VIth may be set at a desired level.

Therefore, as shown in FIG. 7(a)–(c), over a period when the level of the output of the output circuit 12 remains below VIth, the differential amplifier 16 outputs a low level logic signal LGb to its signal processing portion 15a. On the other hand, over a period when the level of the output of the output circuit 12 exceeds the threshold VIth in association with the high output signal LG of the 11, the differential amplifier 16 outputs a high level logic signal LGb to its signal processing portion 15a.

In the second example described above the logic signal LGb output from the differential amplifier 16 thus may switch from low L to high H at delay time tb which is defined as the period required for the output terminal OP1 to reach the threshold level VIth after the CMOS circuit 11 begins to alter its output state.

It should be appreciated that in the second example the input circuit 15 has a large degree of freedom with respect to design parameters since the input circuit 15 is provided with a threshold VIth for use in discriminating the logic levels, by an independent reference signal generation circuit 17. It should be also appreciated that the reference signal generation circuit 17 consists only of p-channel MOS transistors MP3, MP4, MP5, and MP6 and that the output stage of the output circuit 12 consists of p-channel transistors MP1 and MP2, which helps suppress variations in operational characteristics caused by changes in ambient conditions and manufacture non-uniformity, since these changes influence the output levels of the output circuit 12 in the same direction and tend to cancel out. The same is true in the reference signal generation circuit 17.

Figure 8:
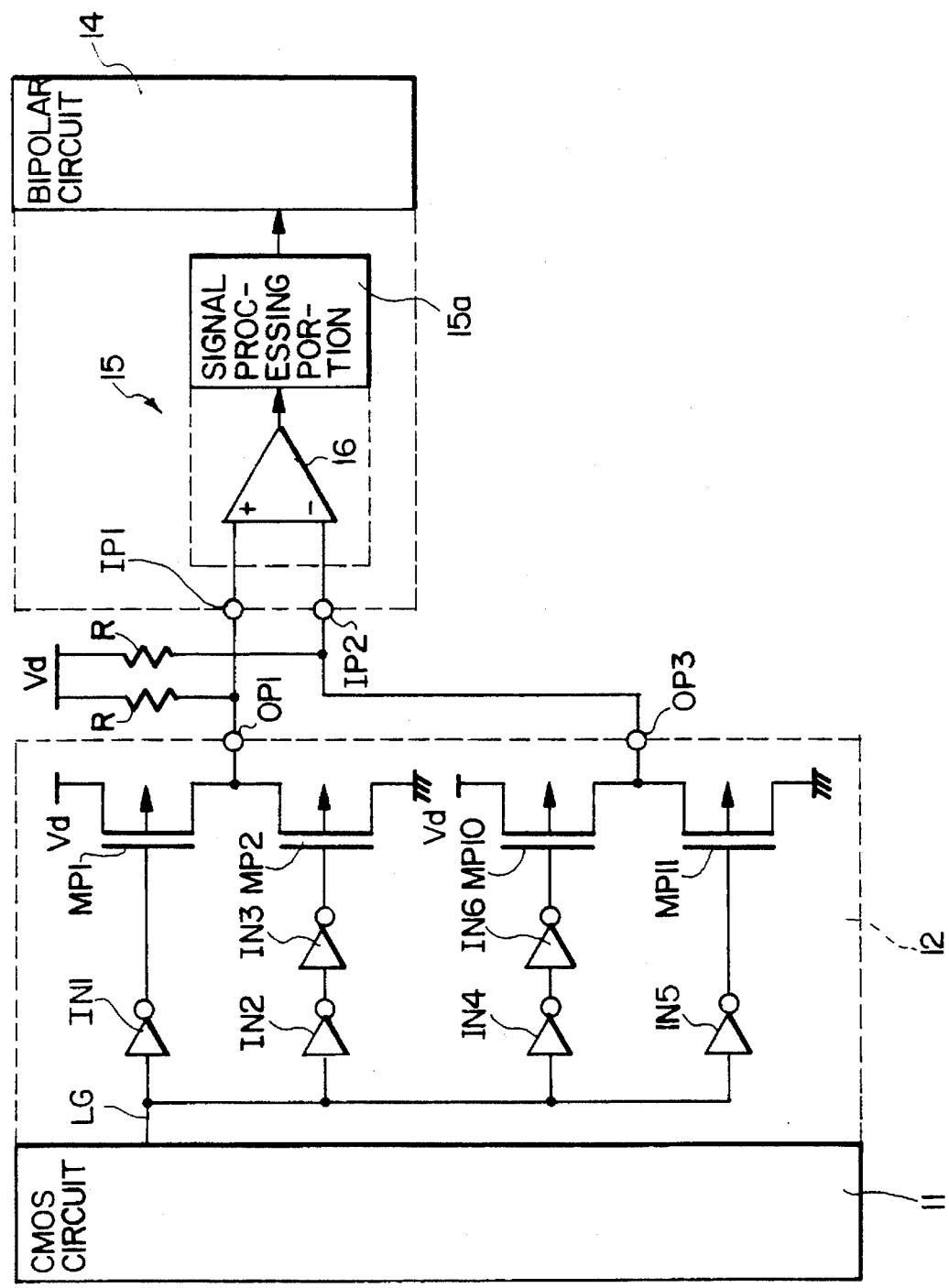
FIG. 8 is an illustration of a third embodiment of the invention.

Referring now to FIG. 8, there is shown a third embodiment of the invention, in which the same reference numbers as in FIGS. 2 and 5 represent the same or similar components.

As shown in the figure the logic signal LG output from a CMOS circuit 11 is supplied to inverters IN1, IN2, IN4 and IN5. The output of the inverter IN4 is connected to the input of the inverter IN6.

The output of the inverter IN6 is connected to the gate of a p-channel transistor MP10. The output of the inverter IN5, which has inverted level with respect to the inverter IN6, is connected to the gate of a p-MOS transistor MP11.

The p-channel MOS transistor MP10 has its drain connected to a power source voltage Vd, and its source connected to the drain of the transistor MP11. The source of the transistor MP11 is grounded. The source of the transistor MP10 and the drain of the transistor MP11 are connected with each other at a common node, to which is connected an output terminal OP3 of the output circuit 12.

The output terminal OP3 is connected to one end of a signal path 18. The other end of the signal path 18 is connected to one terminal IP2 of a bipolar circuit 14. The signal path 18 is also connected to a power source of voltage Vd.

In this arrangement, if the CMOS circuit 11 outputs a logic signal LG at low level L, the output of the inverter IN1 goes to high H, while the output of the inverter IN3 goes to low L. Therefore, in this case the p-channel MOS transistor MP1 is turned OFF, while the transistor MP2 is turned ON, bringing the level of the output terminal OP1 to a level VILp.

At the same time the output of the inverter IN6 goes to low L, while the output of the inverter IN5 goes to high H. Accordingly, the p-channel transistor MP10 is turned ON, and the transistor MP11 is turned OFF, bringing the level of the output terminal OP3 to a level VIHp.

However, if the CMOS circuit 11 outputs a logic signal LG at high level H, the output of the inverter IN1 goes to low L, while the output of the inverter IN 3 goes to high H. Hence, the p-channel MOS transistor MP1 is turned ON, while the transistor MP2 is turned OFF, bringing the output terminal OP1 to the level VIHp.

At the same time the output of the inverter IN6 goes to high H, while the output of the inverter IN5 goes to low L. Hence, the p-channel MOS transistor MP10 is turned OFF, while the transistor MP11 is turned ON, bringing the output terminal OP3 to the level VILp.

Accordingly, as shown in FIGS. 9(a)–(c), as the logic level of the signal LG of the CMOS circuit 11 changes from the level L to the level H, the level of the output terminal OP1 of the output circuit 12 changes from the level VILp to the level VIHp, and the level of the output terminal OP3 from the level VIHp to the level VILp.

The outputs OP1 and OP3 are connected to the plus and minus input terminals IP1 and IP2, respectively, of a differential amplifier 16 serving as an input circuit for the bipolar circuit 14. The differential amplifier 16 thus outputs to the signal processing portion 15a of the input circuit 15 a logic signal LGc at low level L when the level of the output terminal OP1 is less than that of the output terminal OP3.

As the level of the output terminal OP1 exceeds that of the output terminal OP3, the differential amplifier 16 outputs to the signal processing portion 15a a signal LGc at high level H.

Accordingly, in the third embodiment described above, the logic signal LGc output from the differential amplifier 16 may switch from low L to high H at delay time tc after the CMOS circuit 11 begins to alter its output LG from low L towards high H. It should be noted that in the third example the differential amplifier 15 provides the bipolar circuit 14 with an input signal which is doubled in amplitude compared to the amplitude of the signal received from the output circuit 12, so that influence of noise on the input signal may be greatly reduced.

Figure 10:
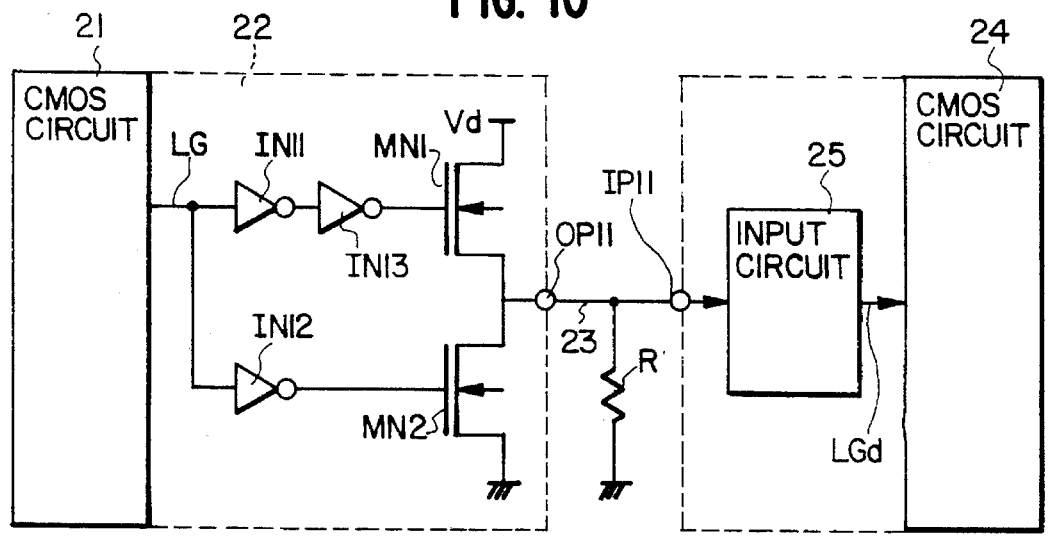
FIG. 10 is an illustration of a fourth embodiment of the invention.

FIG. 10 illustrates a fourth embodiment of the invention, in which the same reference numbers as in FIG. 2 represent the same or similar components.

A CMOS circuit 21 consisting of CMOS transistors outputs a logic signal LG from its output circuit 22 to a signal path 23, which is connected to ground by a terminal resistor R for adjusting the impedance of the signal path 23. In an output circuit 22 the output signal LG from the CMOS circuit 21 is applied to inverter circuits IN11 and IN12. The output of the inverter circuit IN11 is connected to an inverter circuit IN13.

The output of the inverter circuit IN13 is connected to the gate of an n-channel MOS transistor MN 1. The output signal from the inverter circuit IN13 is inverted with respect to the output signal of the output circuit 12, which is applied to the gate of an n-MOS transistor MN 2.

The drain of the n-channel MOS transistor MN1 is coupled to the power source of voltage Vd. The source of the transistor MN1 is coupled to the drain of the transistor MN2.

The source of the transistor MN2 is grounded. The source of the transistor MN1 and the drain of the transistor MN2 are connected with each other and with an output terminal OP11.

The output terminal OP11 of the output circuit 22 is connected with one end of the signal path 23, while the other end of the signal path 23 is connected with an input IP11 of the CMOS circuit 24 which consists of integrated CMOS semiconductors. The input IP11 is connected with an input terminal of the input circuit 25. The signal output from the input circuit 25 is applied to the CMOS circuit 24 as an input logic signal LGd thereto.

In this construction the output of the inverter circuit IN13 goes low L, and the output of the inverter circuit IN12 goes high H, when the CMOS circuit 21 outputs a logic signal LG at level low L. Accordingly, the n-channel MOS transistor MN1 is turned OFF, and n-channel MOS transistor MN2 turned ON.

An equivalent circuit for the output circuit 22 is, as shown in FIG. 11(a), an ON-state resistor R1on of the n-channel MOS transistor MN2 connected in parallel with the terminal resistor R between the ground and the output terminal OP11.

The output of the inverter circuit IN13 goes low H, and the output level of the inverter circuit IN12 goes high L when the CMOS circuit 21 outputs a logic signal LG at level high H.

Accordingly, the n-channel MOS transistor MN1 is turned ON, and n-channel MOS transistor MN2 in turned OFF.

In this case the output circuit 22 is equivalent to a circuit shown in FIG. 11(b), which is a series of a DC power source DN1 representing the threshold voltage VTPN of the n-channel MOS transistor MN1, the ON-state resistor r1on of the n-channel MOS transistor MN1, and the terminal resistor all connected in this order between the power source of voltage Vd and the ground.

Accordingly, when the output logic signal LG is low L, the output terminal OP11 assumes a level VILn which is substantially equal to the ground level.

On the other hand, when the output logic signal LG is high H, the output terminal OP11 assumes a level VIHn which equals the power source voltage Vd minus the threshold voltage VTN1, multiplied by the ratio of the ON-state resistor r1on to the sum of r1on and R, as shown in FIG. 12(a).

Therefore, in order to discriminate the logic level high H from the logic low L input to the input circuit 25, a threshold voltage VNth is set to a point intermediate between the levels VILn and VIHn. Thus, as shown in FIG. 12(b) and (c), the output signal LGd of the input circuit 25 changes from low L to high H as the level of the output terminal OP11 of the output circuit 22 rises from the level VILn and reaches the intermediate level VNth in response to the change in logic level of the output signal LG of the CMOS circuit 21 from its low L to high H. This change takes a certain delay time td as shown in FIG. 12(c).

Thus, in the fourth embodiment the input logic signal LGd output from the input circuit 25 changes to high H at delay time td after the alteration in logic level of the output signal LG of the CMOS circuit 21.

Since the signal on the signal path 23 connected to the input circuit 25 is limited in amplitude within a small range from VILn to VIHn, delay time td is significantly smaller compared with prior art delay time, thereby permitting faster signal transfer.

In a typical example where the power source voltage Vd is 5 volt; the terminal resistance R, 50 ohms; and the threshold voltage VTN1, in the range 1.2–1.3 volts, the value of VIHn is approximately 2 volts. In this case the threshold voltage VNth is preferably set in the range 1.3–1.5 volts.

It should be noted that the output stage of the circuit 22 is constituted of an n-channel MOS transistors MP1 and MP2, which greatly helps suppress variations in operational characteristics caused by varying ambient conditions and manufacturing non-uniformities, since these variations influence the levels of the output circuit 12 and the reference signal generation circuit 17 in the same manner and tend to cancel out.

Figure 13:
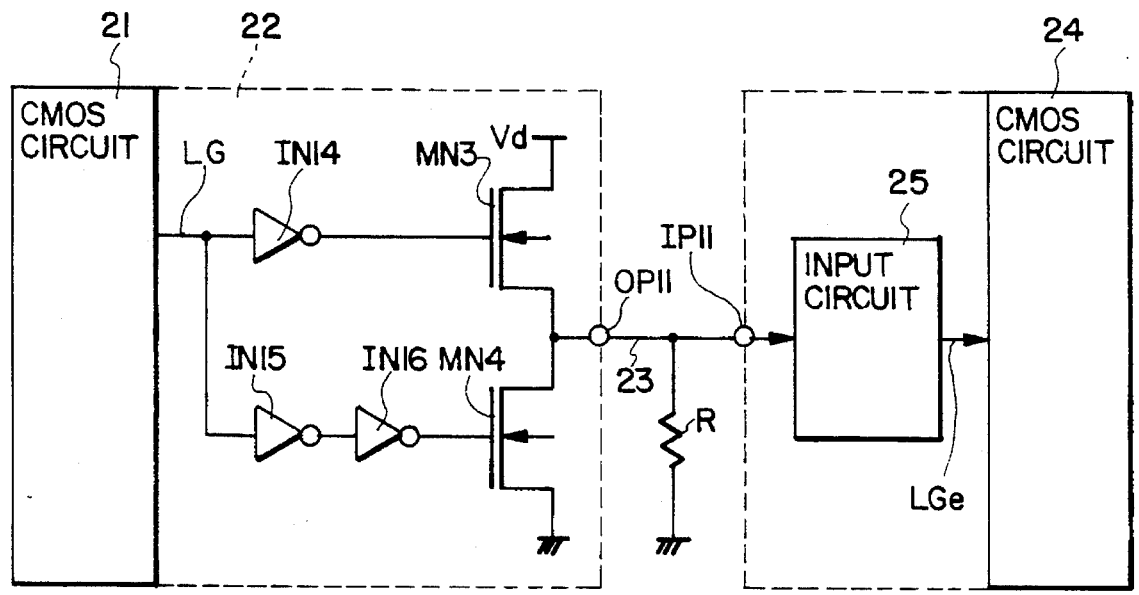
FIG. 13 is an illustration of a fifth embodiment of the invention.

FIG. 13 illustrates a fifth embodiment of the invention, in which the same reference numbers as in FIG. 10 represent the same or similar components.

In a output circuit 22 the signal LG output from the CMOS circuit 21 is applied to inverter circuits IN14 and IN15. The signal output from the inverter circuit IN15 is applied to an inverter inverter circuit IN16.

The output of the inverter circuit IN14 is coupled to the gate of an n-channel MOS transistor MN3. The output signal of the inverter circuit IN16 is inverted with respect to the output signal of the inverter circuit IN16, and is applied to the gate of an n-MOS transistor MN4.

The drain of the n-channel MOS transistor MN3 is coupled to a power source of voltage Vd. The source of the transistor MN3 is coupled to the drain of the transistor MN4. The source of the transistor MN4 is grounded. The source of the transistor MN3 and the drain of the transistor MN4 are connected with each other and with an output terminal OP11.

In this construction the output of the inverter circuit IN14 goes high H and the output of the inverter circuit IN16 goes low L when the CMOS circuit 21 outputs a logic signal LG at level low L. Accordingly, the n-channel MOS transistor MN8 is turned ON, and n-channel MOS transistor MN2 in turned OFF.

On the other hand, the output of the inverter circuit IN14 goes low L and the output of the inverter circuit IN16 goes high H when the CMOS circuit 21 outputs a logic signal LG at level high H. Accordingly, the n-channel MOS transistor MN3 is turned OFF, and n-channel MOS transistor MN4 in turned ON.

Thus, in the example described, the level of the logic signal LG of the CMOS circuit 21 is inverted with respect to the level of the logic signal LGe of the input circuit 25, shown in FIG. 14(a), (b), and (c).

Figure 15:
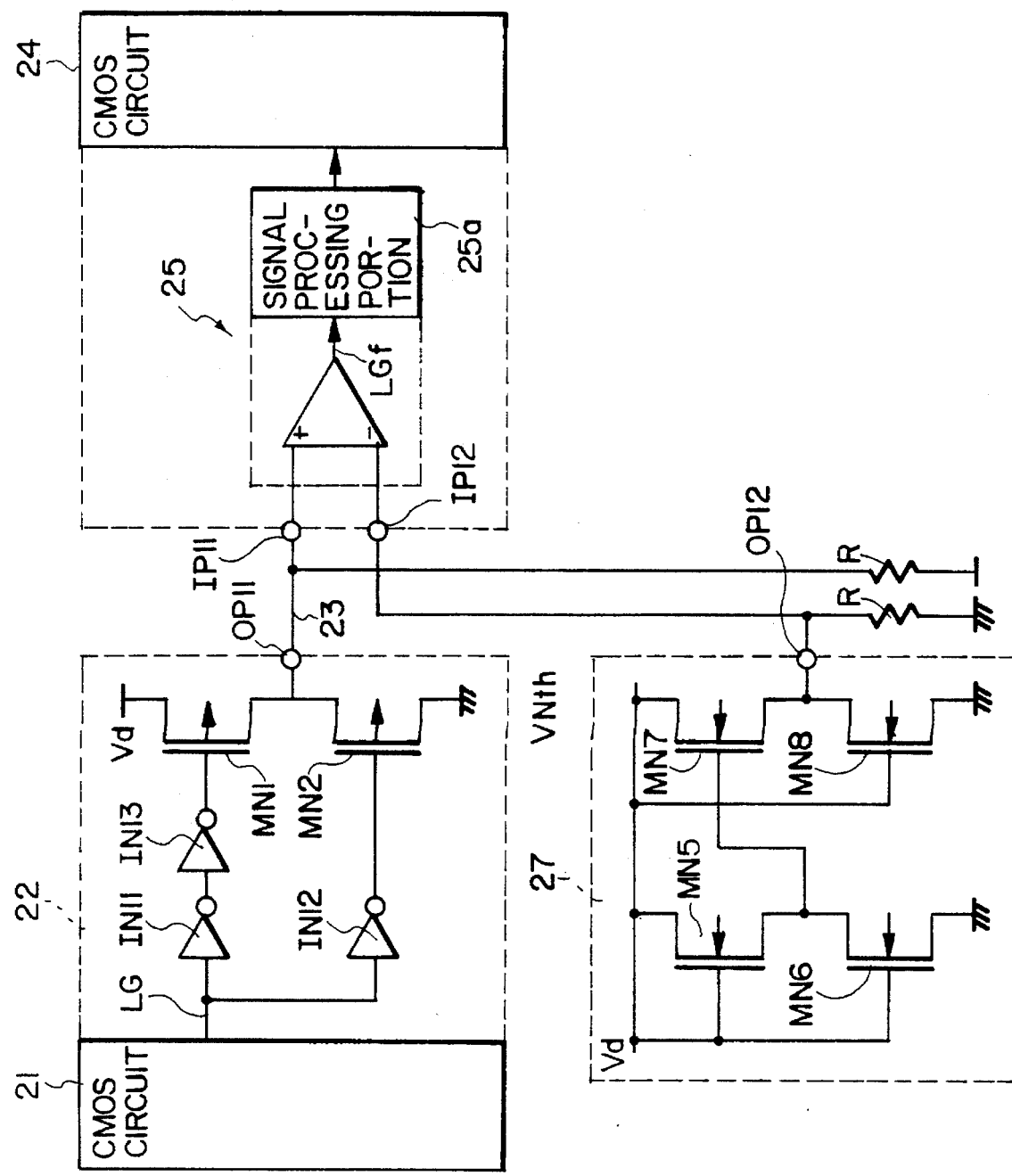
FIG. 15 is an illustration of a sixth embodiment of the invention.

Referring now to FIG. 15, there is shown a sixth embodiment of the invention, in which the same reference numbers as in FIG. 10 represent the same or similar components. A CMOS circuit 24 has an input circuit 25 including a differential amplifier 26 and a signal processing portion 25a.

The plus and minus terminals of the differential amplifier 26 constitute the input terminals IP11 and IP12, respectively, for the circuit 24. The signal output from the differential amplifier 26 is supplied to the signal processing portion 25a as an input logic signal thereto.

A reference signal generation circuit 27 includes a set of n-channel MOS transistors MN5 and MN6, with the drain of the transistor MN5 connected to a power source of voltage Vd, the source of the transistor MN6 grounded, and the source of the transistor MN5 connected to the drain of the transistor MN6. The gates of the transistors MN5 and MN6 are connected to the power source of voltage Vd. Accordingly, both the transistors MN5 and MN6 are always turned ON.

The reference signal generation circuit 17 also has another set of n-channel transistors MN7 and MN8, with the drain of the transistor MN7 connected to the the power source of voltage Vd, the source of the transistor MN8 grounded, and the source of the transistor MN7 connected with the drain of the transistor MN8. The gate of the transistor MN8 is connected to the power source Vd. Accordingly, the transistor MN8 is always turned ON. The gate of the transistor MN7 is connected to a node common to the source of the transistor MN5 and the drain of the transistor MN6, thereby allowing the gate to share the same the voltage as the drain of the transistor MN6.

The source of the transistor MN7 and the drain of the transistor MN8 are also connected to a common output terminal OP12 of the reference signal generation circuit 27.

The output terminal OP12 is connected to the input terminal IP12 of the CMOS circuit 24 to supply the minus terminal of the differential amplifier 26 with a threshold voltage VNth. FIG. 16(a) shows an equivalent circuit for the reference signal generation circuit 27. The portion including the n-channel MOS transistors MN5 and MN6 is equivalent to a series of a DC voltage DN5 representing the threshold voltage VTN5 of the transistor MN5, ON-state resistances r5on and r6on of transistors MN5 and MN6, respectively, connected in this order between the power source Vd and the ground.

As a result, the gate voltage of the transistor MN7 equals the source voltage Vd minus the threshold voltage VTN5, multiplied by the ratio of the ON-state resistance r5on to the sum of r5on and r6on.

Similarly, the portion including the n-channel transistors MN7 and MN8 is equivalent to a series of a DC voltage source DV7 which equals in magnitude to the gate voltage VRN of the transistor MN7, ON-state resistances r7on and r8on of the n-channel transistors MN7 and MN 8, respectively, connected in this order between the power source of Vd and the ground.

Accordingly, as shown in FIG. 16(b), the threshold voltage VNth is the source voltage Vd minus the voltage VRN, multiplied by the ratio of the resistance r7on to the sum of r7on and r8on.

Thus, by appropriately choosing the values of the ON-state resistances r5on, r6on, r7on, and r8on, of the n-channel transistors MN5, MN6, MN7, and MN8, respectively, the threshold voltage VNth may be set at a desired level.

As shown in FIG. 17(a)–(c), over a period when the level of the output of the output circuit 22 remains below VNth, the differential amplifier 26 outputs a low level logic signal LGf to its signal processing portion 25a. On the other hand, when the level of the output terminal OP11 exceeds the threshold VNth, the differential amplifier 26 outputs a high level logic signal LGf to its signal processing portion 25a.

Thus, in the sixth example described above the logic signal LGf output from the differential amplifier 26 may switch from low L to high H at delay time tf which is defined as the time required for the output at terminal OP11 to reach the threshold level VNth after the CMOS circuit 21 begins to alter its output state from low L to high H.

Figure 18:
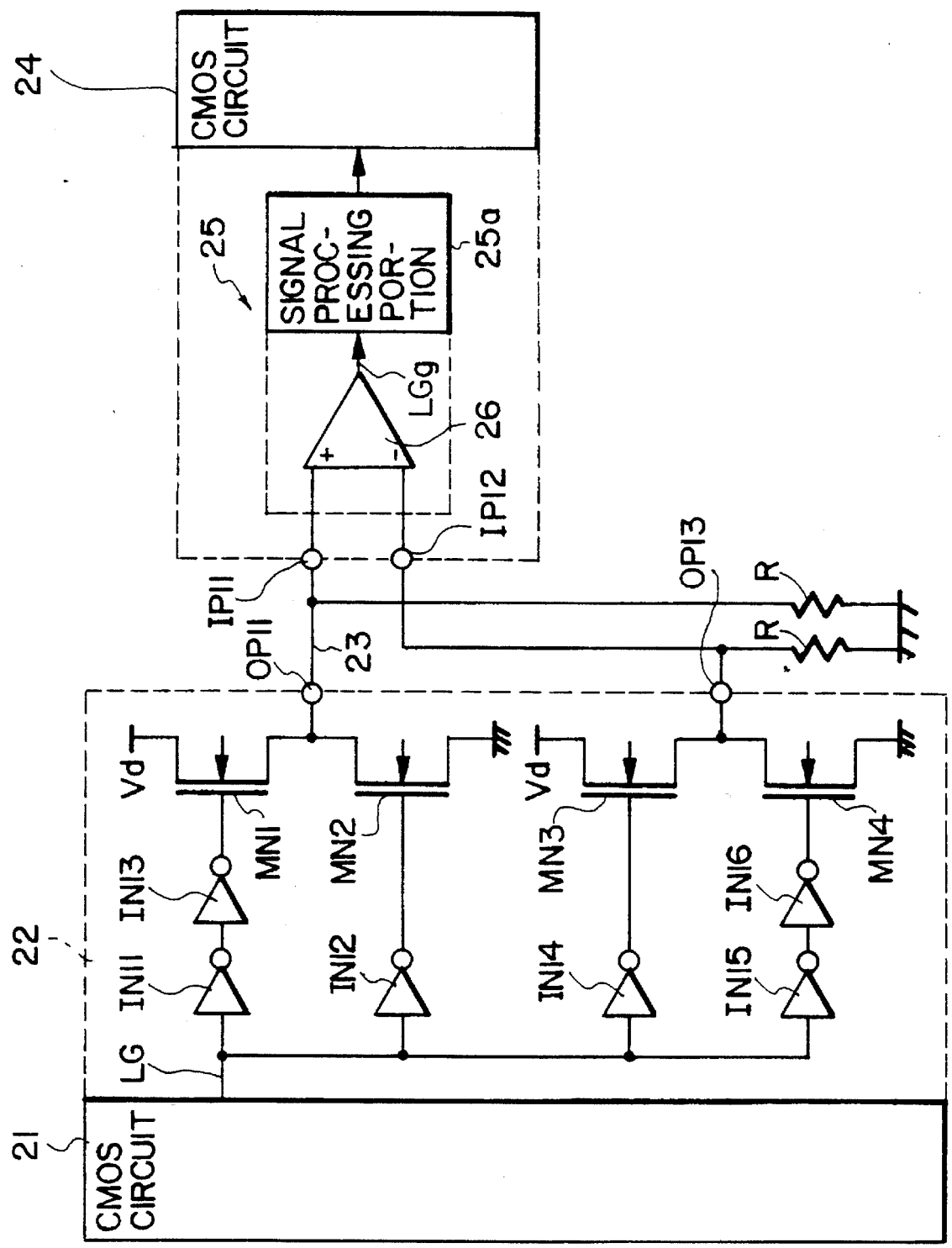
FIG. 18 is an illustration of a seventh embodiment of the invention.

It should be appreciated that the input circuit 25 has a large degree of freedom with respect to design parameters since the input circuit 25 is provided with a threshold VNth generated by an independent reference signal generation circuit 27. It should be also appreciated that the reference signal generation circuit 27 consists only of n-channel MOS transistors MN5, MN6, MN7, and MN8 and that the output stage of the output circuit 22 consists of n-channel transistors MN1 and MN2, which helps suppress variations in operational characteristics caused by changes in ambient conditions and manufacturing non-uniformities, since these variations influence the levels of the output signal of the output circuit 22 in the same manner and tend to cancel out. The same is true in the reference signal generation circuit Referring now to FIG. 18, there is shown a seventh embodiment of the invention, in which the same reference numbers as in FIGS. 10 and 13 represent the same or similar components.

A logic signal LG output to an output circuit 22 of a CMOS circuit 21 is supplied to inverters IN11, IN12, IN14, and IN15. The output of the inverter IN11 is connected to the input of the inverter IN13. The output of the inverter IN15 is connected to the inverter IN16.

The output of the inverter IN13 is connected to the gate of an n-channel MOS transistor MN1. The output of the inverter IN12 is inverted with respect to the output of the inverter IN13, and is connected to the gate of an n-channel MOS transistor MN2.

The n-channel MOS transistor MN1 has its drain connected to a power source of voltage Vd, its source connected to the drain of the transistor MN2. The source of the transistor MN2 is grounded. The source of the transistor MN1 and the drain of the transistor MN2 are connected with each other and to an output terminal OP11.

The output of the inverter IN14 is connected to the gate of an n-channel MOS transistor MN3. The output of the inverter IN16 is inverted with respect to the output of the inverter IN14, and is connected to the gate of an n-channel MOS transistor MN4.

The n-channel MOS transistor MN3 has its drain connected to the power source of voltage Vd, its source connected to the drain of the transistor MN4. The source of the transistor MN4 is grounded. The source of the transistor MN3 and the drain of the transistor MN4 are connected with each other and to an output terminal OP13 of an output circuit of the CMOS circuit 21.

The output terminal OP13 is connected to an input terminal IP12 of a CMOS circuit 24 via a signal path 28. The signal path 18 is grounded via a terminal resistor R, which is provided for setting the impedance of the signal path 28 at desired magnitude.

In this arrangement, if the CMOS circuit 21 outputs a logic signal LG at low level L, the output of the inverter IN13 goes low L, while the output of the inverter IN12 goes high H.

Therefore, the n-channel MOS transistor MN1 is turned OFF, while the transistor MN2 is turned ON, bringing the level of the output terminal OP11 to a level VILn.

At the same time the output of the inverter IN14 goes high H, while the output of the inverter IN16 goes low L. Accordingly, the n-channel transistor MN3 is turned ON, while the transistor MN4 is turned OFF, yielding an output of voltage VIHn at the output terminal OP13.

However, if the CMOS circuit 21 outputs a logic signal LG at a high level H, the output of the inverter IN13 goes high H, while the output of the inverter IN12 goes low L. Hence, the n-channel MOS transistor MN1 is turned ON, while the transistor MN2 is turned OFF, yielding an output of voltage VILn at the output terminal OP11.

At the same time the output of the inverter IN14 goes low L, while the output of the inverter IN16 goes high H. Hence, the n-channel MOS transistor MN3 is turned OFF, while the transistor MN4 is turned ON, yielding an output of voltage VILn at the output terminal OP13.

Accordingly, as shown in FIG. 19(a)–(c), as the CMOS circuit 21 alters the logic level of the signal LG from low L to high H, the level of the output terminal OP11 of the output circuit 22 will be changed from VILn to VIHn, and the level of the output terminal OP13 from the level VIHn to the level VILn.

The output terminals OP11 and OP13 are connected, via input terminals IP11 and IP12, respectively, to the plus and minus input terminals, respectively, of a differential amplifier differential amplifier 26. The differential amplifier 26 then outputs to the signal processing portion 25a of the input circuit 25 of a CMOS circuit 24 a logic signal LGg at low level L when the level of the output terminal OP11 is less than that of the output terminal OP13.

As the level of the output terminal OP11 exceeds that of the output terminal OP13, the differential amplifier 26 outputs to the signal processing portion 25a a signal LGg at high level H.

In this manner, in the seventh example described above the logic signal LGg output from the differential amplifier 26 may switch from low L to high H at delay time tc after the CMOS circuit 21 begins to alter the level of its output LG from low L to high H.

It should be noted that in the seventh embodiment the differential amplifier 26 provides the CMOS circuit 24 with an input signal which is doubled in amplitude compared to the signal received from the output circuit 22, so that influence of noise on the input signal may be greatly reduced.

We claim:

1. Interconnection circuitry for two integrated semiconductor circuits for transferring a logic signal from a first level in one of said integrated circuits to a second level in the other of said integrated circuits through a signal path therebetween, said interconnection circuitry being provided with a terminal resistor in said signal path for adjusting impedances, said interconnection circuitry comprising:

a first portion comprising:

an output circuit for said one of said semiconductor circuits for outputting a logic signal, said output circuit comprising:

an inverter circuit for inverting the logic signal:

a first p-channel MOS transistor, having a gate which is connected with an output of said inverter circuit; and a second p-channel MOS transistor having a drain which is coupled to the source of said first MOS transistor, and a gate which is coupled to an output of said inverter circuit;

a first node common to the source of said first p-channel MOS transistor and the drain of said second p-channel MOS transistor being connected with one end of said signal path;

a second portion, comprising:

an input circuit for the other of said integrated semiconductor circuits, said input circuit comprising a circuit for discriminating whether the level of the signal on said signal path is greater than a reference signal;

a third portion, comprising:

a reference signal generator circuit for generating said reference signal at a level which is substantially intermediate a maximum and a minimum value of said second level.

2. An interconnection circuitry for two integrated semiconductor circuits according to claim 1, wherein said one integrated semiconductor circuit is a CMOS semiconductor circuit, while the other of said integrated semiconductor is a bipolar semiconductor circuit.

3. Interconnection circuitry for two integrated semiconductor circuits according to claim 1, wherein said reference signal generator circuit comprises:

first and second reference p-channel MOS transistors, both of which are adapted to be always in an on state:

said second reference p-channel MOS transistor having a drain which is connected with the source of said first reference p-channel MOS transistor;

a third reference p-channel MOS transistor which is adapted to be always in an on state; and a fourth reference p-channel MOS transistor whose gate is connected with a third node common to the source of said first reference p-channel MOS transistor and said drain of said second reference p-channel MOS transistor, a drain of said fourth p-channel MOS transistor being connected with the source of said third reference p-channel MOS transistor at a fourth node, the voltage of said fourth node being output as said reference signal.

4. Interconnection circuitry for two integrated semiconductor circuits for transferring a logic signal from a first level in one of said integrated circuits to a second level in the other of said integrated circuits through a signal path therebetween, said interconnection circuitry being provided with a terminal resistor in said signal path for adjusting impedances, said interconnection circuitry comprising:

a first portion comprising:

an output circuit for one of said semiconductor circuits outputting a logic signal, said output circuit comprising:

an inverter circuit for inverting the logic signal;

a first n-channel MOS transistor, having a gate which is connected with an output of said inverter circuit; and a second n-channel MOS transistor having a source which is coupled to the drain of said first n-channel MOS transistor, and a gate which is coupled to an output of said inverter circuit;

a first node common to the drain of said first n-channel MOS transistor and the source of said second n-channel MOS transistor being connected with one end of said signal path;

a second portion, comprising:

an input circuit of the other of said other integrated semiconductor circuits, said input circuit comprising:

a circuit for, discriminating whether or not the level of the signal on said signal path is greater than a reference signal;

a third portion, comprising:

a reference signal generator for generating said reference signal at a level which is substantially intermediate a maximum and a minimum value of said second level.

5. Interconnection circuitry for interconnecting two integrated semiconductor circuits according to claim 4, wherein said reference signal generator circuit comprises:

first and second reference n-channel MOS transistors, both of which are adapted to be always turned on;

said second reference n-channel MOS transistor having a drain which is connected with the source of said first n-channel MOS transistor at a reference node;

a third reference n-channel MOS transistor which is adapted to be always turned on; and a fourth reference n-channel MOS transistor whose gate is connected with a second node common to the source of said first n-channel MOS transistor and the drain of said second n-channel MOS transistor, and whose source is connected with the drain of said third n-channel MOS transistor, with the voltage of said reference node being output as said reference signal.

6. Interconnection circuitry as claimed in claim 1, wherein said inverter circuit has at least two outputs, said two outputs are inverted with respect to each other, one of said outputs being connected to the gate of said first transistor and the other of said outputs being connected to the gate of said second transistor.

7. Interconnection circuitry as claimed in claim 2, wherein said inverter circuit has at least two outputs, said two outputs are inverted with respect to each other, one of said outputs being connected to the gate of said first transistor and the other of said outputs being connected to the gate of said second transistor.

8. Interconnection circuitry as claimed in claim 3, wherein said inverter circuit has at least two outputs, said two outputs are inverted with respect to each other, one of said outputs being connected to the gate of said first transistor and the other of said outputs being connected to the gate of said second transistor.

9. Interconnection circuitry as claimed in claim 4, wherein said inverter circuit has at least two outputs, said two outputs are inverted with respect to each other, one of said outputs being connected to the gate of said first transistor and the other of said outputs being connected to the gate of said second transistor.

10. Interconnection circuitry as claimed in claim 5, wherein said inverter circuit has at least two outputs, said two outputs are inverted with respect to each other, one of said outputs being connected to the gate of said first transistor and the other of said outputs being connected to the gate of said second transistor.

11. Interconnection circuitry as claimed in claim 1, wherein said output circuit is integrated on said one of said semiconductor circuits and said input circuit is integrated on said other of said semiconductor circuits.

12. Interconnection circuitry as claimed in claim 2, wherein said output circuit is integrated on said one of said semiconductor circuits and said input circuit is integrated on said other of said semiconductor circuits.

13. Interconnection circuitry as claimed in claim 3, wherein said output circuit is integrated on said one of said semiconductor circuits and said input circuit is integrated on said other of said semiconductor circuits.

14. Interconnection circuitry as claimed in claim 4, wherein said output circuit is integrated on said one of said semiconductor circuits and said input circuit is integrated on said other of said semiconductor circuits.

15. Interconnection circuitry as claimed in claim 5, wherein said output circuit is integrated on said one of said semiconductor circuits and said input circuit is integrated on said other of said semiconductor circuits.

* * * * *

UNITED STATES PATENT AND TRADEMARK OFFICE
CERTIFICATE OF CORRECTION

PATENT NO. : 5,469,081
DATED : November 21, 1995
INVENTOR(S) : Satomi HORITA, Yasushi AOKI, Hiroshi OKAMOTO, Kiyohiko CHIBA and Shizue DAIKOKU It is certified that error appears in the above-indentified patent and that said Letters Patent is hereby corrected as shown below:

Col. 1, line 38, after "circuit" insert --3.--.

Col. 12, line 20, delete "IN16" and insert --IN14--.

Col. 12, line 33, delete "MN8" and insert --MN3--.

Signed and Sealed this

Fourteenth Day of May, 1996

Attest:

BRUCE LEHMAN

*Attesting Officer*         *Commissioner of Patents and Trademarks*